United States Patent [19]

Kim et al.

[11] Patent Number: 5,473,442
[45] Date of Patent: Dec. 5, 1995

[54] VCE CONTROL OF A CABLE CONVERTER UNIT

[75] Inventors: Sung J. Kim, Hamilton County; Alfred J. Schick, Marlon County, both of Ind.

[73] Assignee: Thomson Consumer Electronics, Inc., Indianapolis, Ind.

[21] Appl. No.: 382,931

[22] Filed: Feb. 1, 1995

Related U.S. Application Data

[63] Continuation of Ser. No. 807,068, Dec. 13, 1991, abandoned.

[51] Int. Cl.⁶ .................................................. H04N 5/76
[52] U.S. Cl. ............................................ 358/335; 360/79
[58] Field of Search ................................ 358/335, 310, 358/342; 455/151, 156, 158, 186, 69, 70; 438/731, 732, 733, 570, 734; 360/79

[56] References Cited

U.S. PATENT DOCUMENTS

| | | | |
|---|---|---|---|
| 3,838,210 | 9/1979 | Peil | 330/29 |
| 4,317,225 | 2/1982 | Henderson et al. | 455/158 |
| 4,776,038 | 10/1988 | Testin et al. | 455/182 |
| 4,879,611 | 11/1989 | FuKine et al. | 360/69 |
| 4,977,655 | 12/1990 | Young | 358/142 |
| 5,123,046 | 6/1992 | Levine | 380/10 |
| 5,210,611 | 5/1993 | Yee et al. | 358/191.1 |
| 5,229,763 | 7/1993 | Nakamaru | 340/825.72 |

*Primary Examiner*—Tommy P. Chin
*Assistant Examiner*—Robert Chevalier
*Attorney, Agent, or Firm*—Joseph S. Tripoli; Peter M. Emanuel; Thomas F. Lenihan

[57] ABSTRACT

A VCR includes circuitry for controlling a cable converter unit, circuitry for detecting the presence of a television signal, and control code transmission circuitry for remotely controlling a cable converter unit. Advantageously, because the VCR is coupled to the output of the cable converter unit, the VCR can monitor the television signals received from the cable converter unit to ensure that commands sent to the cable converter unit from the VCR are executed. It is herein recognized that a skip list programmed into a VCR may be used by the VCR to control a cable box. That is, in response to a channel up command received by the VCR, the VCR would not change channels itself, but rather controls the cable box to select the next preferred channel entered in the skip list of the VCR. In this mode of operation, the channel tuning keys (e.g., CHAN UP, CHAN DN) of the VCR remote control are used to control an external source of signals, while the VCR mechanism control keys (e.g., PLAY, STOP, RECORD, FAST FORWARD) control the operation of the VCR.

7 Claims, 9 Drawing Sheets

5,473,442

VCE CONTROL OF A CABLE CONVERTER UNIT

This is a continuation of application Ser. No. 07/807,068 filed Dec. 13, 1991 now abandoned.

FIELD OF THE INVENTION

The subject application concerns the field of videocassette recorders (VCRs) and apparatus for programming them.

CROSS REFERENCE TO RELATED APPLICATIONS

The subject patent application is related to applications bearing attorney docket number RCA 86,462, RCA 86,526, RCA 86,528, and RCA 86,660 filed herewith, and assigned to the same assignee as the subject invention.

BACKGROUND OF THE INVENTION

When a television set owner is a subscriber to a cable television system and also possesses a videocassette recorder (VCR), he may be required to connect to the cable system via a cable decoder box (also called a CATV converter, or a set-top converter). This connection may be required, because in these systems, many cable channels (i.e., the so-called premium channels) are scrambled (i.e., encoded or encrypted) and must be descrambled (i.e., decoded or decrypted) in the cable box. The cable box descrambles the premium channel and converts its RF carrier frequency from its assigned cable channel frequency to a cable box output frequency, normally that of channel 2, 3, 4, or 5 for reception and recording by the VCR, or display by the television receiver. In such an arrangement the viewer may have as many as three remote control units for controlling the video equipment (i.e., one each for a television set, a VCR, and the cable box). If a user wants to change channels via the tuner of his cable box but inadvertently operates the remote control for the VCR, the VCR will tune away from the output channel of the cable box, causing loss of signal to the VCR, and most probably, also causing a great deal of confusion, especially to a non-technically-trained user.

A second problem arises in connection with lists of preferred channels. It is common practice to include lists of preferred channels in television receivers (TVs) and VCRs. In response to a CHANNEL UP or CHANNEL DOWN command, the TV or VCR skips non-preferred channels and tunes a preferred channel which is next higher or next lower in frequency from the currently-tuned channel. Many skip lists are automatically programmed via an autoprogram feature which steps through all possible channels and programs the skip list with information concerning whether or not each channel is active. Channels not detected in the autoprogram operation may be added by a user via operation of an ADD key. Channels which were detected and stored in the skip list but which nevertheless are not preferred by a user may be deleted from the skip list by operation of a DELETE key. Unfortunately, cable boxes normally do not perform an autoprogramming operation, and do not include skip lists. Thus, confusion arises because, a CHANNEL UP command sent to a VCR will cause the tuning of the next active or preferred channel, while a CHANNEL UP command sent to a cable box will cause the selection of the next higher channel whether that channel is active or not.

SUMMARY OF THE INVENTION

A VCR includes means for controlling a cable converter unit, means for detecting the presence of a television signal, and control code transmission means for remotely controlling a cable converter unit. Advantageously, because the VCR is coupled to the output of the cable converter unit, the VCR can monitor the television signals received from the cable converter unit to ensure that commands sent to the cable converter unit from the VCR are executed. It is herein recognized that a skip list programmed into a VCR may be used by the VCR to control a cable box. That is, in response to a channel up command received by the VCR, the tuner of the VCR would not change channels itself, but rather the VCR controller controls the cable box to select the next preferred channel entered in the skip list of the VCR. In this mode of operation, the channel tuning keys (e.g., CHAN UP, CHAN DN) of the VCR remote control are used to control an external source of signals, while the VCR mechanism control keys (e.g., PLAY, RECORD, FAST FORWARD) control the operation of the VCR.

DETAILED DESCRIPTION OF THE EMBODIMENT

Figure 1:
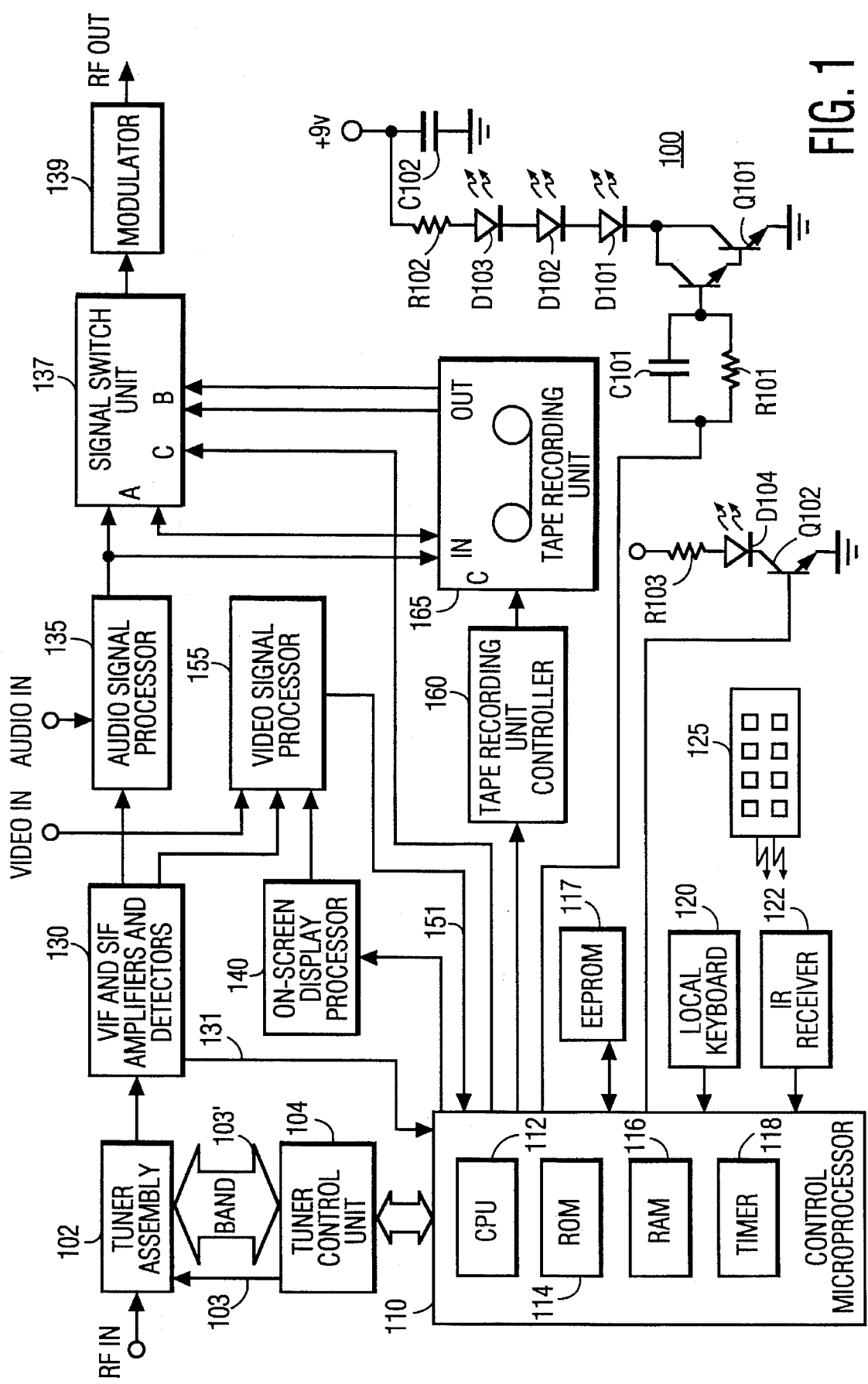
FIG. 1 shows, in block diagram form, a VCR incorporating the subject invention.

Referring to FIG. 1, radio frequency (RF) signals are applied to an RF input terminal of a tuner assembly 102. Tuner assembly 102 selects a particular RF signal under control of a tuner control unit 104 which applies a tuning control signal to tuner assembly 102 via a wire 103, and applies bandswitching signals via a control bus 103'. Tuner control unit 104 is controlled by a controller 110. Controller 110, which may be a microprocessor or microcomputer, includes a central processing unit (CPU) 112, a read-only memory (ROM) 114, a random access memory 116, and an external electrically-erasable read only memory (EEPROM) 117. Controller 110 generates a control signal for causing tuner control unit 104 to control tuner 102 to select a particular RF signal, in response to user-entered control signals from a local keyboard 120 and from an infrared (IR) receiver 122. IR receiver 122 receives and decodes remote control signals transmitted by a remote control unit 125.

Tuner 102 produces a signal at an intermediate frequency (IF) and applies it to a processing unit 130 comprising a video IF (VIF) amplifying stage, an AFT circuit, a video detector, and a sound IF (SIF) amplifying stage processing unit 130 produces a first baseband composite video signal (TV), and a sound carrier signal. The sound carrier signal is applied to an audio signal processor unit 135 which includes an audio detector and may include a stereo decoder. Audio signal processor unit 135 produces a first baseband audio signal and applies it to a signal switch unit 137. Second baseband composite video signals and second baseband audio signals may be applied to VIDEO IN and AUDIO IN terminals from an external source.

The first and second baseband video signals (TV) are coupled to a video processor unit 155 (having a selection circuit not shown) and is also applied to signal switch unit 137. Video and audio signals are also applied to a tape recorder unit 165 which causes the signals to be recorded onto video tape. Tape recorder unit 165 has a control input and operates under control of a tape recorder unit controller 160, which may be a microprocessor. Tape recorder unit controller 160 is in turn controlled by control signals from controller 110. Under control of controller 110, an on-screen display processor 140 generates character signals, and applies them to a second input of video signal processor 155, for inclusion in the processed video signal. Signal switch unit 137 is controlled by controller 110 via a control input terminal C to select audio and video signals from audio signal processor 135 and video signal processor 155, or from the output terminals of tape recording unit 165 in the playback mode, and to apply the selected signals to a modulator 139 for modulation onto a particular channel frequency carrier, typically that of channel 3 or channel 4. The circuitry described thus far is known from RCA videocassette recorder model VR520.

Unlike the RCA VR520, which has as its main programming feature a TIMER PROGRAM mode of operation, apparatus according to the subject invention may include both a TIMER PROGRAM programming feature and a VCR PLUS™ programming feature. The control program for the above-mentioned features resides in ROM 114 of controller 110. Electrically-erasable programmable read only memory (EEPROM) 117 is coupled to controller 110, and serves as a non-volatile storage element for storing autoprogramming channel data, user-entered channel data, and VCR PLUS™ channel mapping data.

An IR LED driver circuit, generally, designated 100, is coupled to controller 110, for providing IR signals to external units, such as a cable box for a cable TV service. IR LED driver circuit comprises a filter capacitor C102, a current-limiting resistor R102, three series-connected IR LEDs (infrared light emitting diodes) D101, D102, and D103, a darlington-connected transistor switch Q101, a base resistor R101, and a speed-up capacitor C 101.

Processing unit 130 also produces an IF AGC signal which is coupled to controller 110 via a wire 131, for detection of variation of the signal strength of signals of currently-tuned channels, the changes being indicative of channel changes. Alternatively, video signal processor 155 produces a valid sync detection signal or a video AGC signal which is coupled to controller 110 via a wire 151, for detection of channel changes.

It is herein recognized that in a system in which the VCR relays commands to the cable box, user confusion caused by operating the wrong remote control can be greatly reduced. Copending U.S. patent application bearing attorney docket number RCA 86,462, describes a VCR which controls a cable box and monitors an internal VCR signal to ensure that the commands sent to the cable box were received and executed. It is herein recognized that in such a system, an autoprogramming function can be implemented in which the cable box is controlled to select each channel in sequence, and the VCR examines the received signal to determine if the channel to which the cable box is tuned is an active channel. If so, the VCR enters it in its list of preferred channels, if not, the cable box is directed to tune the next channel in sequence. It is herein recognized that for three reasons, it is a clear advantage for a unit which contains a channel skip list (i.e., the VCR) to control the cable box. First, in general, cable boxes do not include lists of preferred channels (sometimes known as skip lists), and this would add the feature without modifying the cable box. Second, uniformity of operation would be introduced in that a CHANNEL UP or CHANNEL DN command would have the same effect whether the cable box (via the VCR) or VCR were being controlled. Third, if the user were to attempt to change channels via the remote control unit of the VCR, the cable box channel would be changed to the next active channel, and no confusion would result (i.e, the VCR would not tune away from the cable box output channel, as is the case with conventional VCRs).

Apparatus in accordance with the subject invention controls the cable box (i.e., the source of its own video input signals), and monitors the television signals received from the cable box, in a "closed loop" manner. By monitoring the IF AGC signal on line 131 of FIG. 1, controller 110 can detect perturbations of the signal level which indicate that the cable box has changed channels. That is, the output signal of the cable box remodulated on, for example, the RF carrier frequency of channel 3, will be momentarily lost during the period in which the cable box changes channels. Thus, the subject apparatus can determine if a channel change has occurred. It is also recognized that other signals (such as a "Valid Sync Detect" signal or a video AGC signal on line 151 of FIG. 1) can also be monitored to provide this feedback information as to whether commands transmitted to the cable box have actually been received and executed. Advantageously, if a signal which tracks a characteristic of the baseband video signal (such as Valid Sync Detect or video AGC) is used for detecting loss of signal during channel change, then the subject invention is applicable to use with cable boxes which produce decoded cable television signals at baseband rather than remodulating them to a particular television channel frequency.

The present invention will be further described with reference to FIGS. 2a through 2g, 3a and 3b, and 4a through 4i.

Figure 2A:
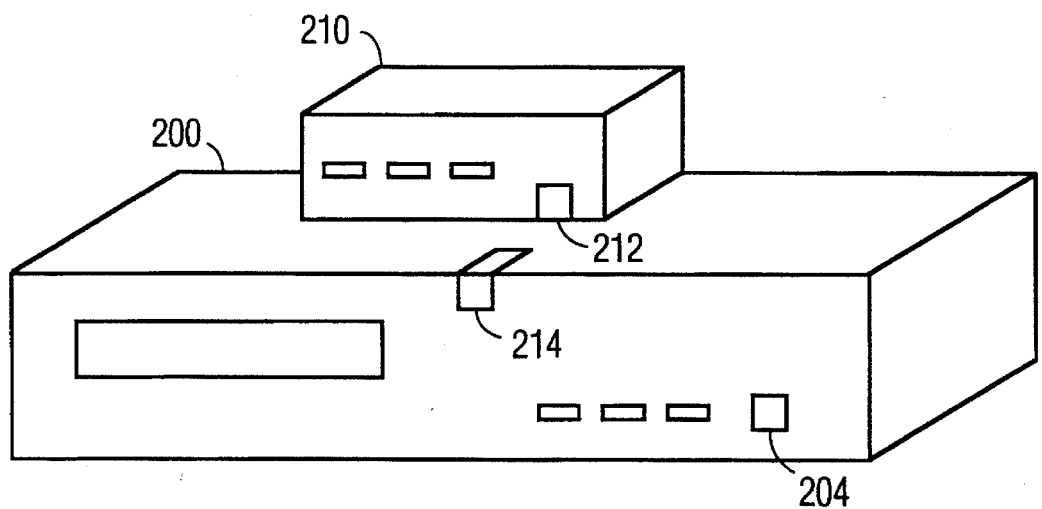
FIGS. 2a and 2b are views of a VCR incorporating the invention.
Figure 2B:
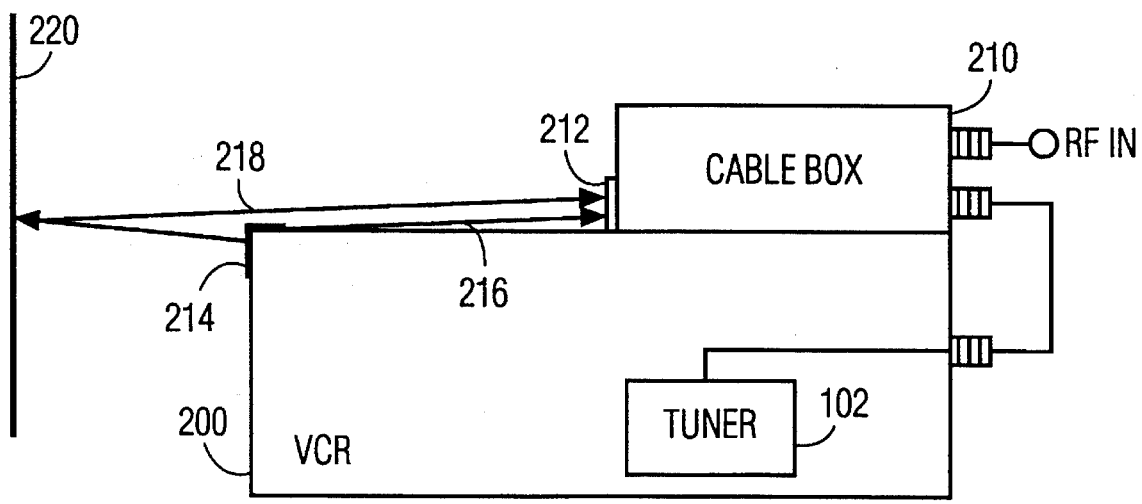

FIG. 2a is a perspective view of a cable box 210 placed VCR 200 having a, In FIG. 2b, VCR 200 is shown coupled to the RF input via cable box 210. Tuner 102 of FIG. 2b is the same tuner unit 102 previously described with respect to FIG. 1. Tuner 102 of FIG. 2b is the same tuner unit 102 previously described with respect to FIG. 1. It is common practice for cable television services to encode (i.e., scramble) at least their "Premium" channels. FIG. 2b is a configuration which may be used when some or all of the television channels provided by the cable television service are encoded in some fashion (i.e., a cable box is required for decoding). In such a configuration, the VCR will be set to record all television programs on the cable box output channel (typically, channel 2, 3, or 4). Cable box 210 of FIGS. 2a and 2b includes a window 212 for admitting an IR (infrared) remote control signal for turning the cable box on and off, and for causing the tuner of the cable box to change channels. VCR 200 of FIG. 2a includes a window 204 for admitting an IR (infrared) remote control signal for turning the VCR on and off, for causing the tuner 102 of the VCR to change channels, and for controlling the recording and playback of videotapes. VCR 200 also includes a window 214 through which IR signals generated by the VCR are transmitted to external units such as cable box 210. Note from FIG. 2b that cable box 210 preferably receives IR signals from window 214 of VCR 200 along a rearward directed path 216, and from a "bounce" path 218 in which the IR signals may be reflected from a wall or other object 220. The "bounce" path is provided for the case in which the user chooses not to place the cable box on top of the VCR.

Figure 3A:
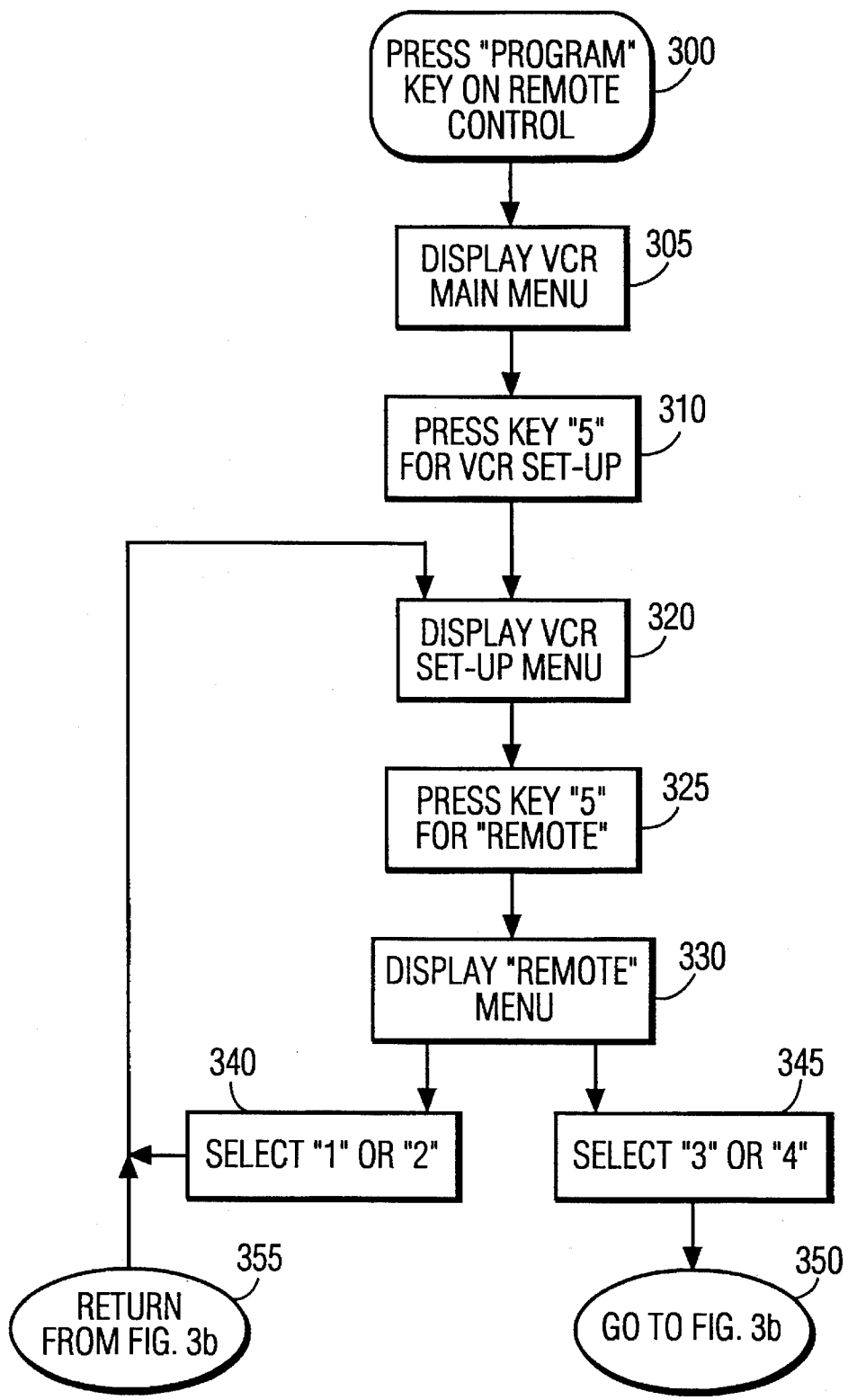
FIGS. 3a and 3b form a flowchart showing a portion of the control program of the controller of FIG. 1.
Figure 3B:
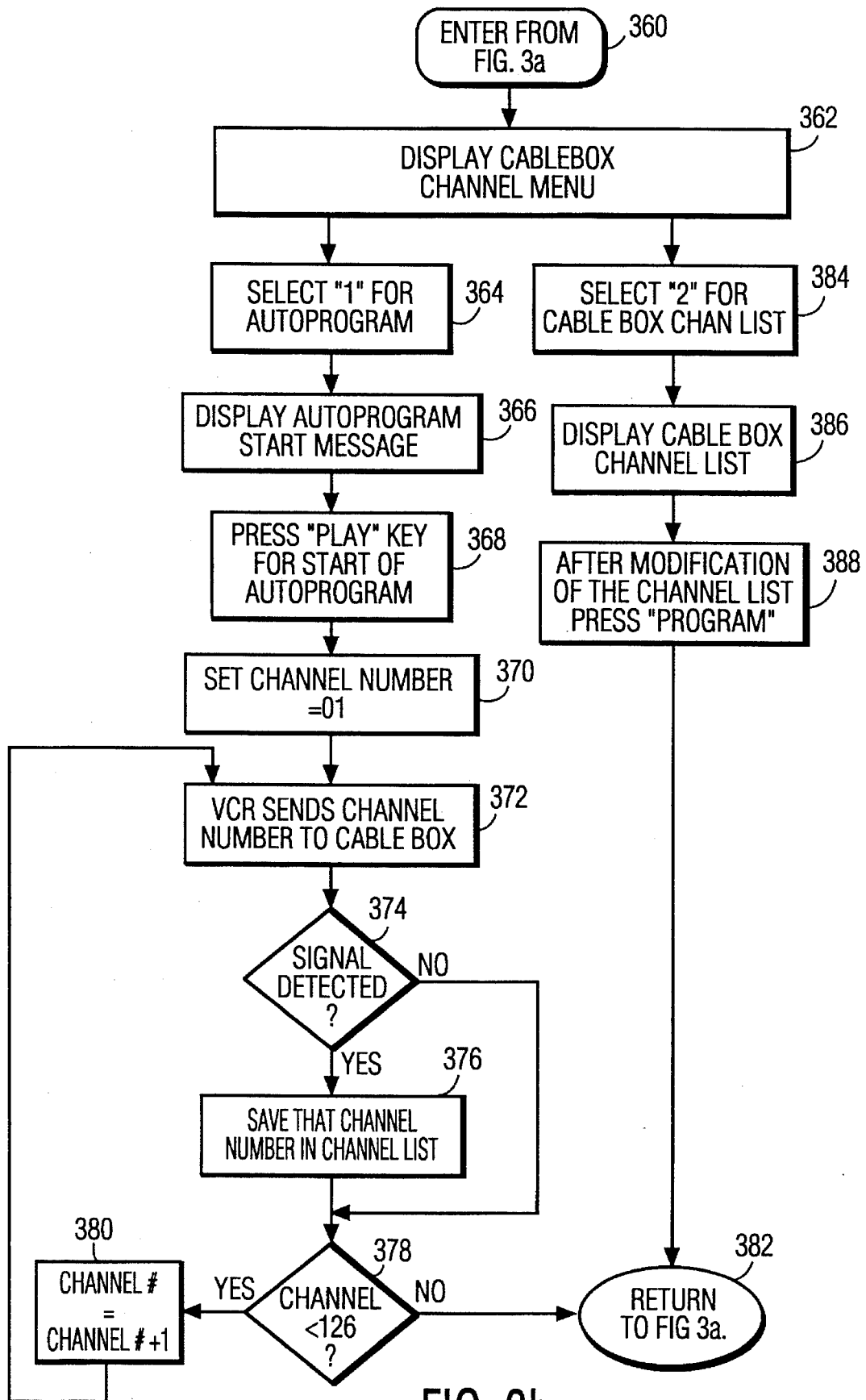

The invention will now be explained with respect to FIGS. 3a and 3b, and FIGS. 4a–4i. With respect to FIGS. 4a–4i, assume that a VCR according to the present invention is coupled to a television set 400a–400i, having a picture tube 410a–410i, respectively. The routine of FIGS. 3a and 3b is entered at step 300 in response to a user pressing the the PROGRAM key on remote control unit 125 of VCR 200. At step 305 the VCR main menu (FIG. 4a) is displayed. Note that by pressing either key 1 or key 2, the user can program a television show for recording by means of the VCR PLUS™ system or by normal TIMER PROGRAM recording, respectively. Options 3 and 4 are standard features and need not be described here. The pressing of either of keys 1 or 2 causes the display of the screen of FIG. 4c. If key 1 is pressed while the screen of FIG. 4c is displayed, it means that the user has a cable television service which does not require a cable box. If key 2 were pressed, it means that the user has a cable box. In that case, the screen of FIG. 4d is displayed, (it is to be understood that the "03" is the output channel of the cable box, and is entered by the user), and the output channel information is stored. If key 2 were entered from screen 4d, it means that all channels are received via the cable box. It is noted that the "cable box output channel" could in fact be a baseband VIDEO OUT terminal of a cable box, in which case the VCR's VIDEO IN terminal would automatically be considered as receiving the signal of the "cable box output channel".

Figure 4A:
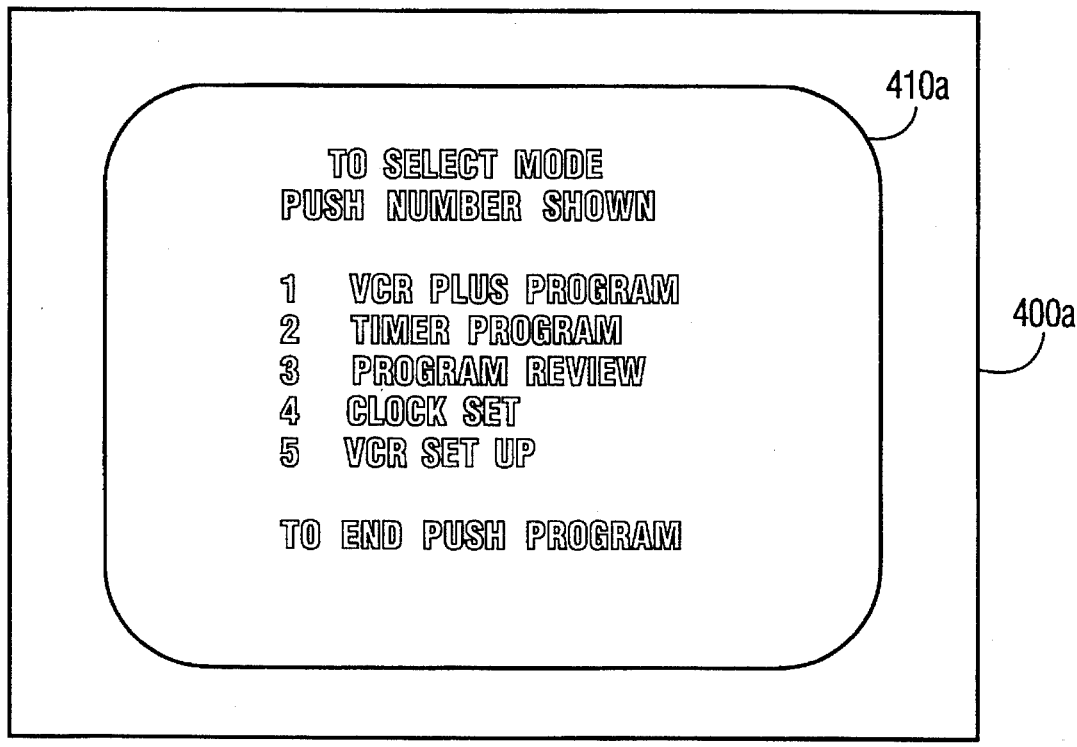
FIGS. 4a–4i are illustrations of display screens generated in accordance with the invention.
Figure 4B:
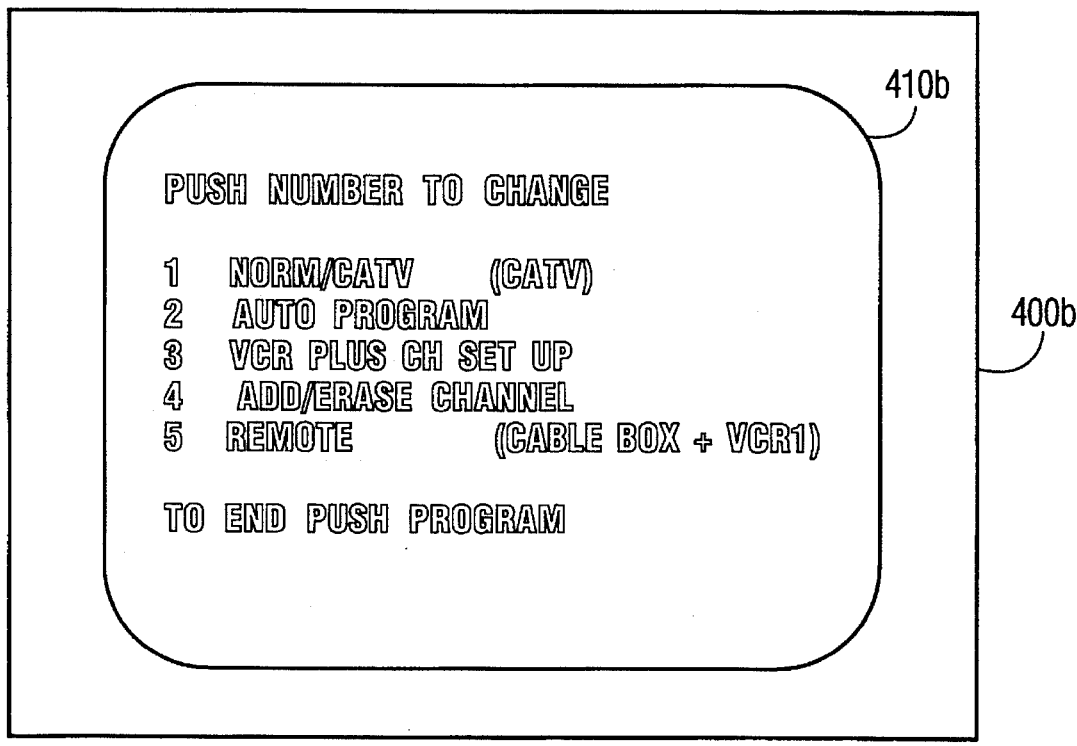
Figure 4C:
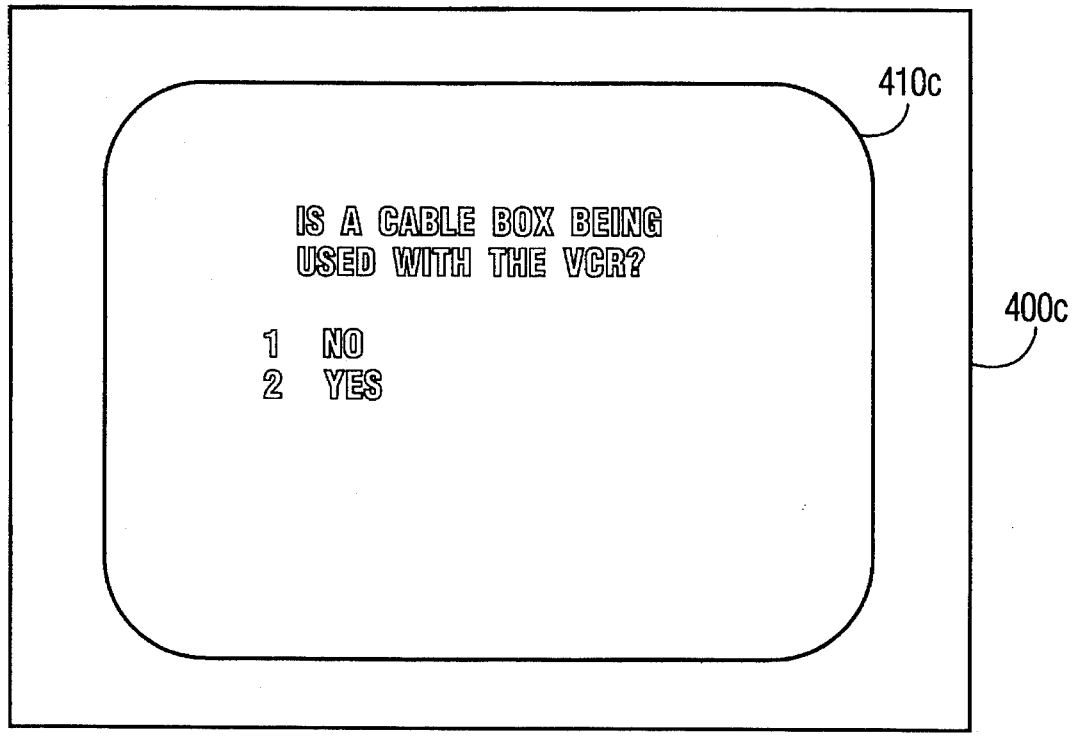
Figure 4D:
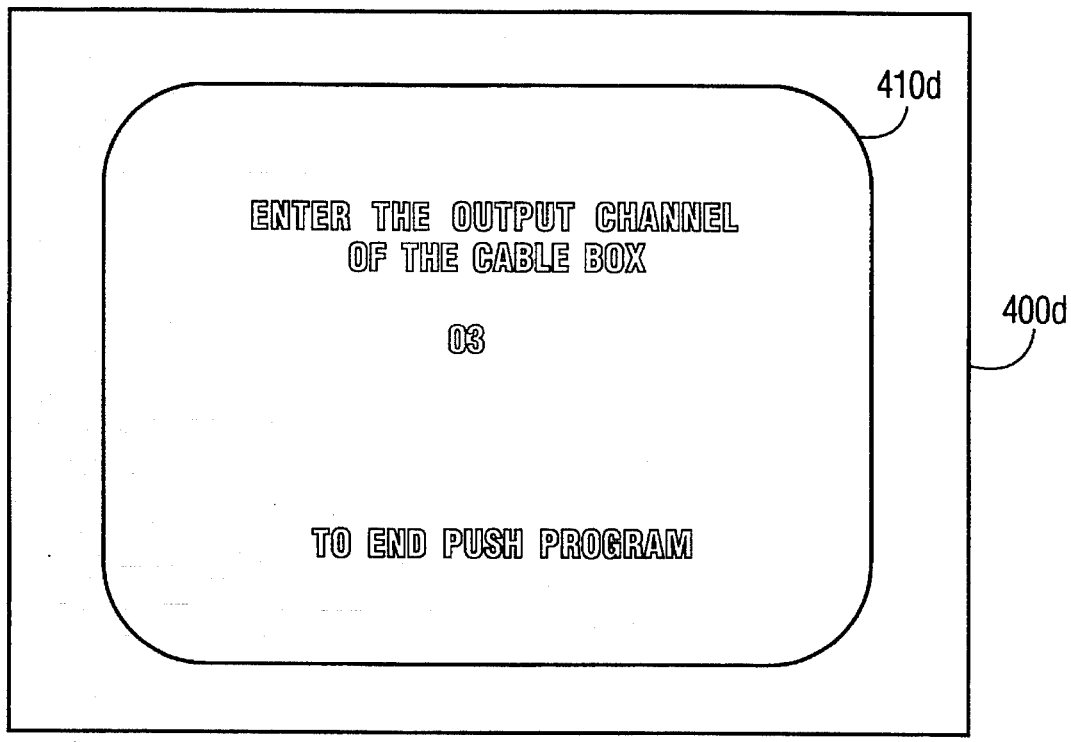
Figure 4E:
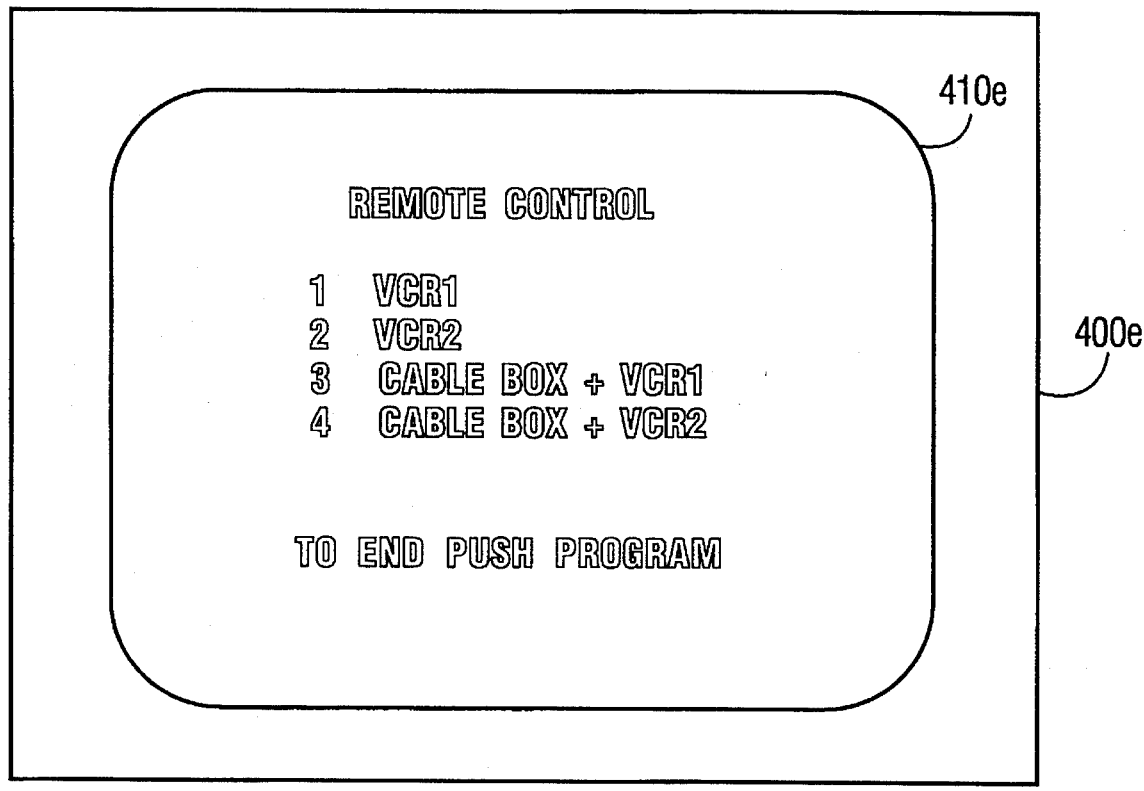
Figure 4F:
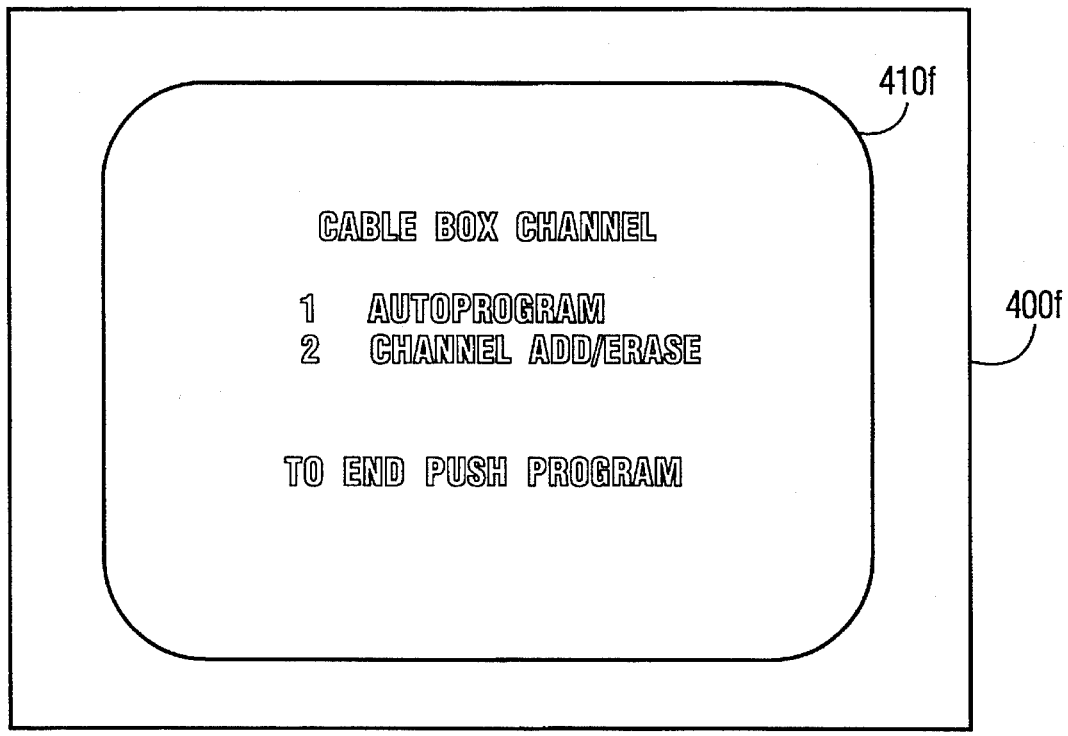
Figure 4G:
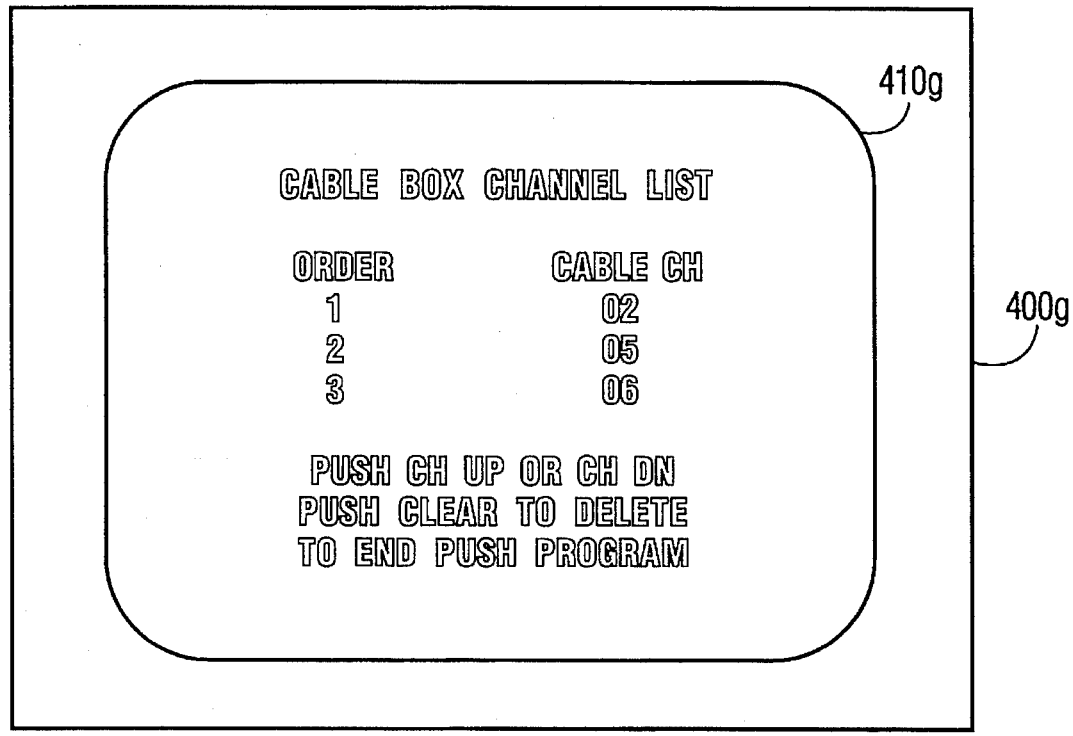

At step 310 of FIG. 3a, in response to the pressing of key number 5, VCR SET UP, the display screen of FIG. 4b is generated (step 320), which provides another list of 5 options. Selecting item 1 enables the user to toggle back and forth between controlling tuner 102 to tune NORMAL (i.e., broadcast or "air") and controlling tuner 102 to tune CATV (i.e., cable) frequencies. Selecting item 2 causes an AUTO-PROGRAM function to be implemented in which tuner 102 is controlled to search for all active channels and compile a list of channels which are available to be tuned, and those which are inactive and are to be skipped over. The selection of menu item 4 allows a user to add a channel to the list or delete a channel from the autoprogram scan list. Selection of menu item 5 (step 325 of FIG. 3a) causes the display of the screen shown in FIG. 4g (step 330). FIG. 4g defines the items which may be selected to be controlled by VCR remote control unit 125. Pressing 1 selects VCR1 for control, and likewise, pressing 2 selects VCR2 for control (step 340). Pressing 3 selects both a cable box and VCR1 for control, and pressing 4 selects both a cable box and VCR2 for control (step 345). It is herein recognized that the REMOTE menu of FIG. 4g could be eliminated when a cable box is identified as being used with the system (FIG. 4c).

Figure 4H:
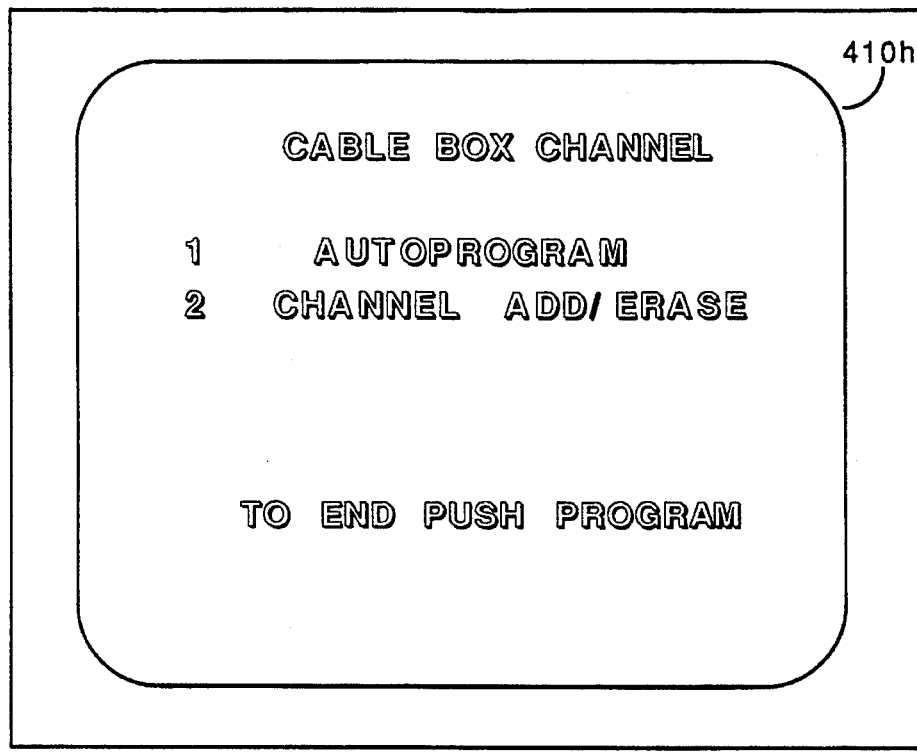

Step 360 of FIG. 3b, is entered from step 345 of FIG. 3a. At step 362, the cable box channel menu of FIG. 4h is displayed. If 1 is selected at step 364, the program advances to step 366 wherein the autoprogram start message of FIG. 4e is displayed. The user is asked to turn on the cable box, and then to press the PLAY key of VCR remote control unit 125. If the PLAY key is pressed (step 368), the program displays the display screen of FIG. 4f. As each cable channel number from 01 to 125 is selected (steps 370 and 372), the channel number at the bottom of FIG. 4f is updated. At step 374, a check is made to see if an active television signal has been detected. If so, the channel number is stored in the list of preferred channels (step 376). If no active television signal is detected, the NO path is taken to step 378 wherein a check is made to see if all 125 channels have been examined. If not, the channel number is incremented (step 380) and the program loops back to step 372. If all 125 channels have been examined, then the program returns to step 355 of FIG. 3a.

Figure 4I:
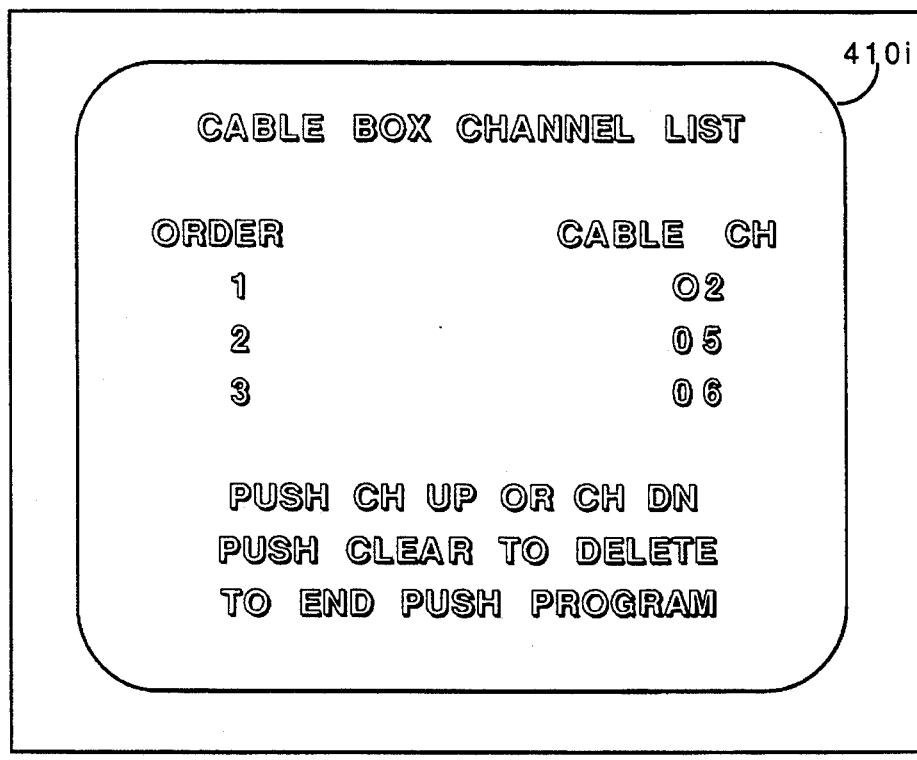

If at step 384 key 2 had been pressed, then the cable box channel list of FIG. 4i would be displayed (step 386). A user may want to modify of the channel list produced by the autoprogramming function. For example, a particular channel may be broadcast in a foreign language, or contain objectionable television programming. In that case, the user may want to delete that channel from the scan list. After modifying the scan list, the user presses the PROGRAM key (step 388), causing the program to return to step 355 of FIG. 3a.

In operation, whenever the VCR is coupled to a cable box for controlling the cable box, VCR remote control unit 125 is treated as if the VCR mechanism keys (e.g., FAST FORWARD, REWIND, STOP, PLAY, RECORD) were to control the VCR, but the tuner control keys (CHAN UP, CHAN DN, and NUMBER KEYS) were to control the cable box. Copending U.S. patent application bearing attorney docket number RCA 86,660 describes a system in which the specific kind of cable box connected to the VCR is automatically determined, in order that the proper control code format may be used to send channel change commands from the VCR to the cable box.

Although the VCR PLUS™ system is referred to in the subject specification, it is herein recognized that the subject invention does not require the use of the VCR PLUS™ system and is extremely useful with standard timer recording.

What is claimed is:

1. A videocassette recorder having cable box control capability, comprising:

an input terminal for coupling to a television signal output terminal of said cable box for receiving a television signal on a particular channel;

a tuner for tuning said particular television channel of a number of channels in response to a control signal, said particular channel being the output channel of said cable box;

a controller for generating said control signal for causing said tuner to select said particular television channel;

a data input circuit, coupled to said controller, for entering data in response to operation by a user;

a memory circuit coupled to said controller for storing channel data and data corresponding to said commands for controlling said cable box; and a remote control signal transmitter coupled to said controller for transmitting remote control signals for controlling said cable box, said cable box having a tuner for selecting one of a plurality of RF signals and converting said selected RF signal to said particular television channel for application to said videocassette recorder;

said controller in response to data entered by said user generates said remote control signals and applies said remote control signals to said remote control signal transmitter; and a detector for detecting an active television signal, said detector being coupled to said tuner of said VCR for receiving a signal derived from said particular channel, and in response to the detection of a predetermined characteristic of a television signal on said predetermined channel generates a signal indicative of an active television signal and applies said indicative signal to said controller, said indicative signal exhibiting a variation when said tuner of said cable box is tuned from channel to channel;

said controller causes transmission of said remote control signals to said cable box to cause said tuner of said cable box to select channels sequentially and said controller performs an autoprogramming function by monitoring said indicative signal for said variation as a feedback signal to determine which of said sequentially selected channels is an active television channel, and storing a list of said active television channels in said memory circuit of said VCR;

said controller in response to a CHANNEL UP command or a CHANNEL DOWN command entered by a user, maintains said tuner of said videocassette recorder on said particular television channel and transmits a channel change command to said cable box, causing said cable box to tune to a next active channel of said list in a desired direction of change.

2. The videocassette recorder of claim 1, wherein said remote control signal transmitter is an IR LED assembly, and said remote control signals are IR signals.

3. The videocassette recorder of claim 1, wherein said detector is an automatic gain control (AGC) circuit, and said signal indicative of an active television signal is an AGC signal.

4. The videocassette recorder of claim 1, wherein said detector is a valid television synchronizing signal detection circuit, and said signal indicative of an active television synchronizing signal.

5. A videocassette recorder for controlling a cable box, comprising:

a baseband video signal input terminal, for receiving a baseband video signal from said cable box, said cable box having a tuner for selecting a particular channel from a plurality of channels and deriving said baseband signal therefrom;

a controller for generating control signals;

a data input circuit, coupled to said controller, for entering data in response to operation by a user;

a memory circuit coupled to said controller for storing channel data and data corresponding to said commands for controlling said cable box; and a transmitter coupled to said controller for transmitting remote control signals for controlling said cable box said controller in response to data entered by said user generates said remote control signals and applies said remote control signals to said remote control signal transmitter; and a detector for detecting an active television signal, said detector being coupled to said baseband video signal input terminal for receiving said baseband video signal, and in response to the detection of a predetermined characteristic of said baseband video signal generates a signal indicative of an active television signal and applies said indicative signal to said controller, said indicative signal exhibiting a variation when said tuner of said cable box is tuned from channel to channel;

said controller transmits said remote control signals to cause said cable box to select channels sequentially and said controller performs an autoprogramming function by monitoring said indicative signal for Said variation as a feedback signal to determine which of said sequentially selected channels is an active television channel and storing a list of said active television channels in said memory circuit of said VCR;

said controller in response to a channel change command entered by a user, causes said video input terminal to continue to receive said baseband video signal and transmits a channel change command to said cable box causing said cable box to tune to a next active channel of said list in a desired direction of change.

6. The videocassette recorder of claim 5, wherein said transmitter is an IR LED assembly, and said remote control signals are IR signals.

7. The videocassette recorder of claim 5, wherein said detector is a valid television synchronizing signal detection circuit, and said signal indicative of an valid television synchronizing signal.

* * * * *